(12) United States Patent
Kim

(10) Patent No.: US 12,033,932 B2
(45) Date of Patent: Jul. 9, 2024

(54) THERMAL AND ELECTRICAL INTERFACE FOR FLIP-CHIP DEVICES

(71) Applicant: Gerald Ho Kim, Ontario, CA (US)

(72) Inventor: Gerald Ho Kim, Ontario, CA (US)

(*) Notice: Subject to any disclaimer, the term of this patent is extended or adjusted under 35 U.S.C. 154(b) by 351 days.

(21) Appl. No.: 17/374,185

(22) Filed: Jul. 13, 2021

(65) Prior Publication Data

US 2022/0037249 A1 Feb. 3, 2022

Related U.S. Application Data

(60) Provisional application No. 63/057,521, filed on Jul. 28, 2020.

(51) Int. Cl.
*H01L 23/498* (2006.01)
*H01L 23/367* (2006.01)

(52) U.S. Cl.
CPC ...... *H01L 23/49838* (2013.01); *H01L 23/367* (2013.01)

(58) Field of Classification Search
CPC ....... H01L 23/13; H01L 23/498–49894; H01L 23/538–5389; H01L 2224/16257; H01L 2224/10152; H01L 2224/26152
See application file for complete search history.

(56) References Cited

U.S. PATENT DOCUMENTS

2012/0313240 A1* 12/2012 Cheng ............... H01L 23/49822
257/737

* cited by examiner

*Primary Examiner* — Tucker J Wright
(74) *Attorney, Agent, or Firm* — Han IP PLLC; Andy M. Han

(57) ABSTRACT

An interface device includes a double-trench structure configured to bond to a flip-chip device electrically and thermally. The double-trench structure is at least partially metalized and configured to allow a soldering material to flow along each of at least two trenches of the double-trench structure. The two trenches are closely located adjacent to each other to minimize an electrical separation gap between a cathode and an anode of the flip-chip device while providing electrical isolation therebetween.

10 Claims, 6 Drawing Sheets

SECTION A-A

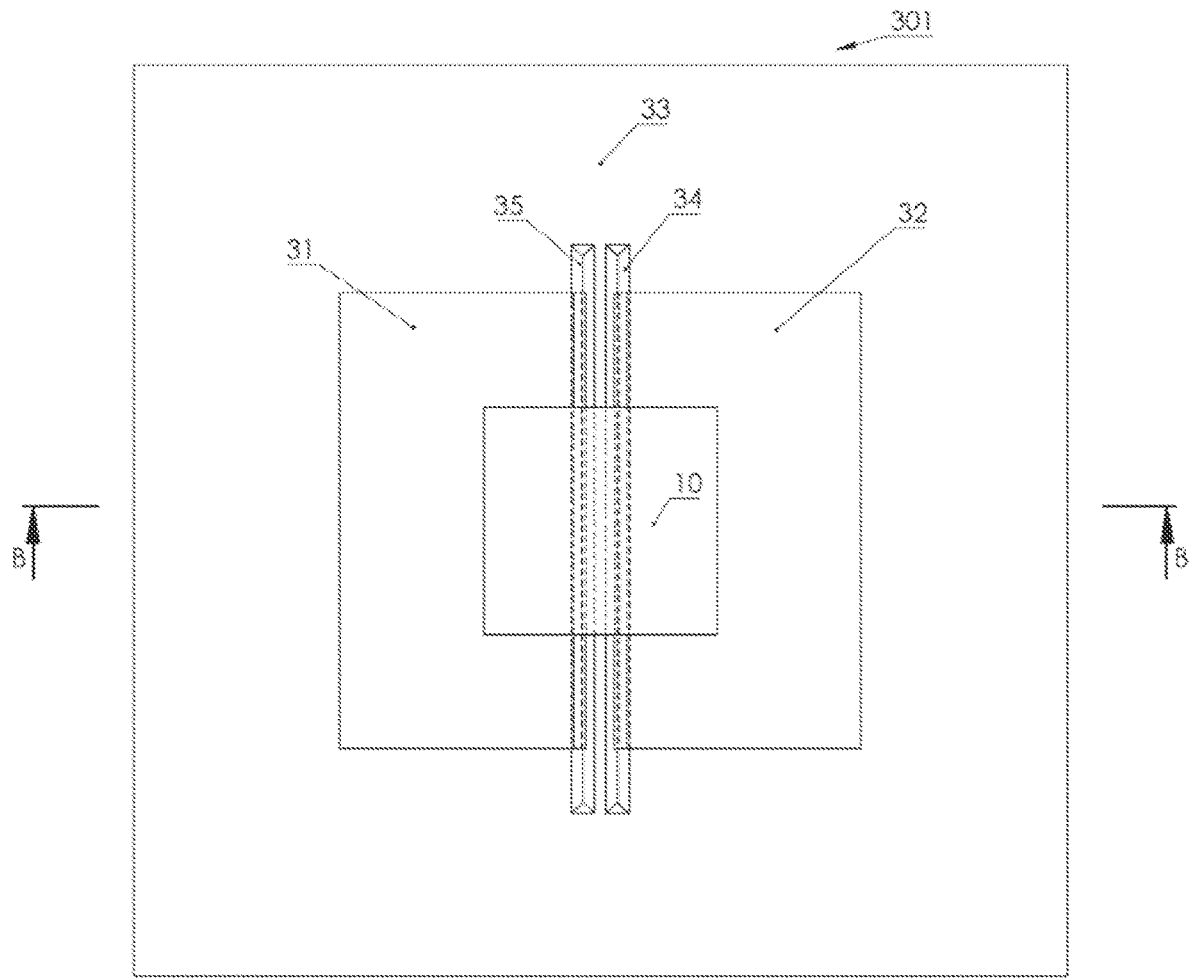
Figure 5
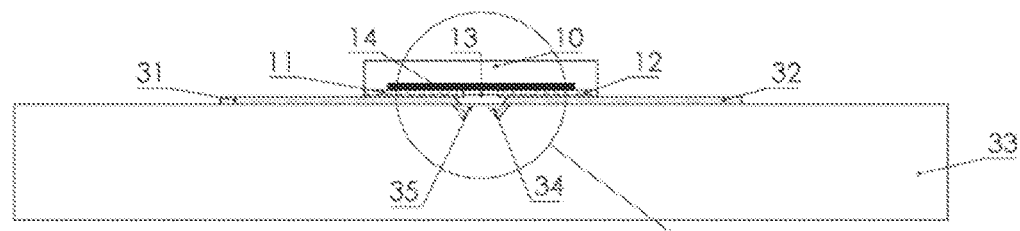
SECTION B-B      Figure 6
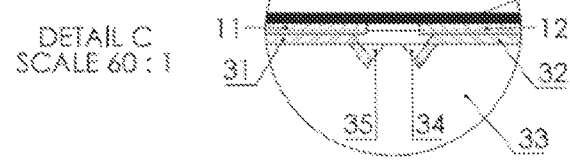
DETAIL C
SCALE 60:1

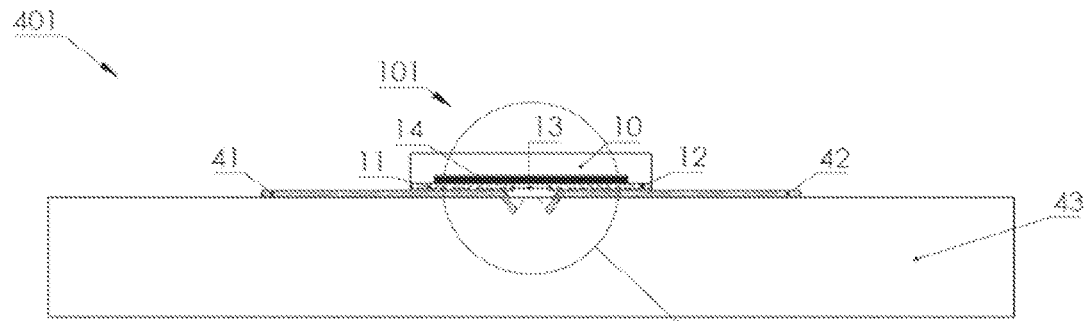
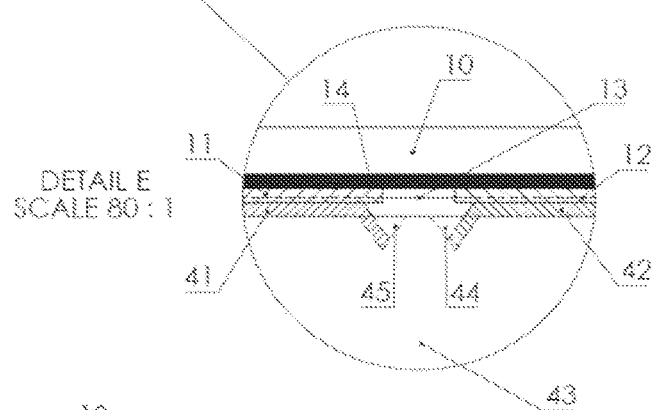
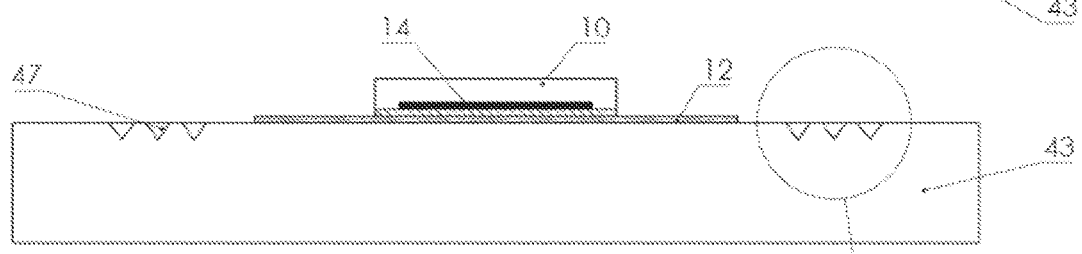
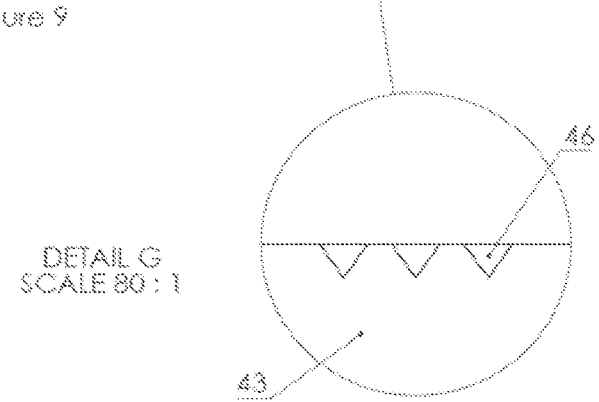

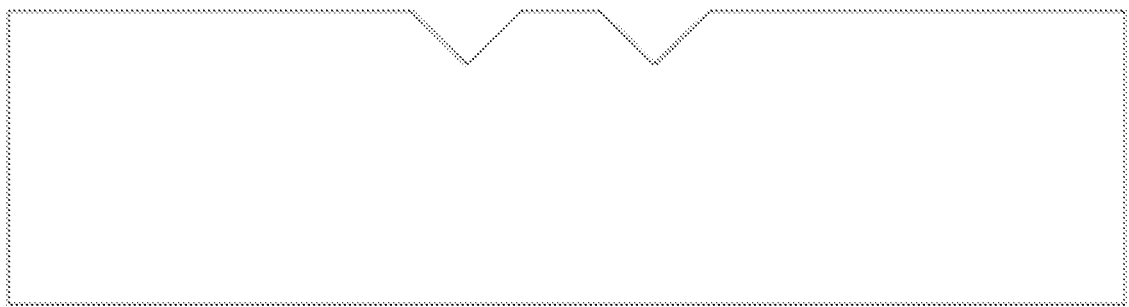
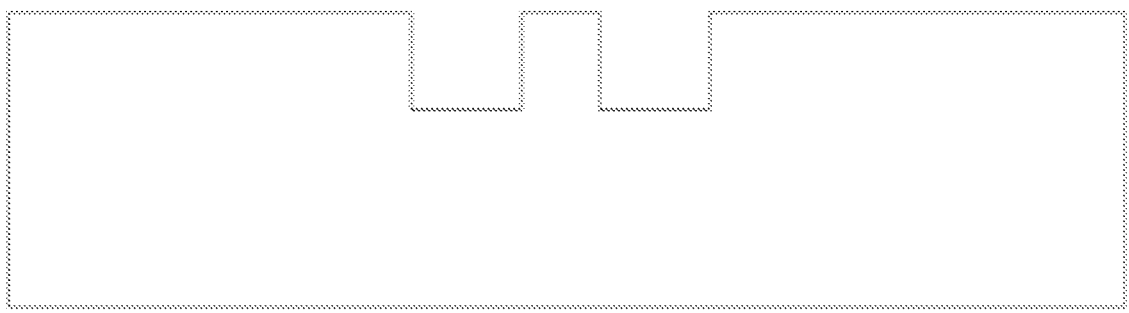
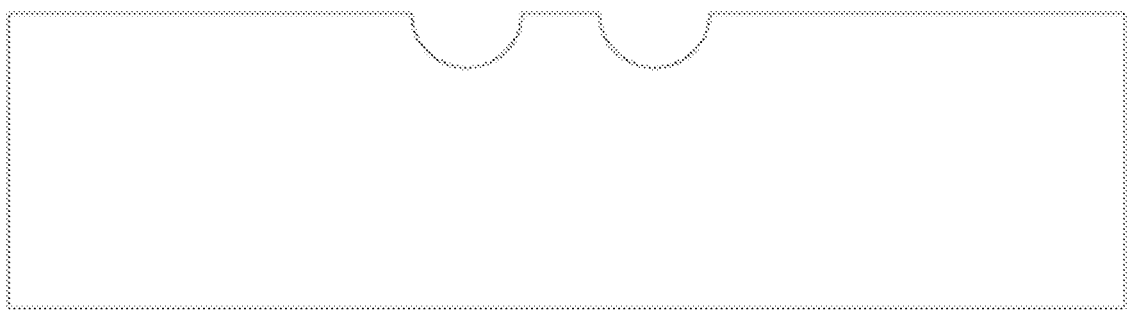
Figure 10

THERMAL AND ELECTRICAL INTERFACE FOR FLIP-CHIP DEVICES

CROSS REFERENCE TO RELATED PATENT APPLICATION(S)

The present disclosure claims the priority benefit of U.S. Patent Application No. 63/057,521, filed 28 Jul. 2020, the content of which being incorporated by reference in its entirety.

TECHNICAL FIELD

The present disclosure generally relates to flip-chip devices and, more particularly, to a thermal and electrical interface for flip-chip devices.

BACKGROUND

Unless otherwise indicated herein, the approaches described in this section are not prior art to the claims in this application and are not admitted as prior art by inclusion in this section.

One major issue of mounting a flip-chip integrated circuit (IC) on an interface substrate is electrical isolation of all electrical pads. Due to high-density packaging of the electrical pads, there is a higher risk of shorting the electrical pads while they are bonded to the interface substrate or a printed circuit board (PCB). For instance, with respect to a high-power flip-chip IC such as an ultraviolet-C (UVC) light-emitting diode (LED) chip, a cathode and an anode thereof need to be connected to the electrical pads on a PCB with adequate separation distance between an electrical pad for the cathode and another electrical pad for the anode. If the electrical pads are not spaced apart by enough distance, a solder material used to bond the LED chip to the PDC could possibly cause short circuit and thereby damage the LED chip.

Another issue in designing electrical pads is removal of heat from a flip-chip IC. Due to this reason it is desirable to maximize a contact area between an electrical pad and a PCB. However, a large separation distance of the cathode and anode tends to weaken the thermal transfer efficiency of the flip-chip IC since most of the heat dissipation is usually conducted through both electrodes. Any surface area that is not bonded to an interface substrate such as a metal PCB or interface substrate would not dissipate heat from the flip-chip IC. Therefore, the flip-chip would suffer from higher temperature effect such as lower performance and shorter lifetime.

SUMMARY

The following summary is illustrative only and is not intended to be limiting in any way. That is, the following summary is provided to introduce concepts relating to a thermal and electrical interface for flip-chip devices. Select embodiments of the novel and non-obvious technique are further described below in the detailed description. Thus, the following summary is not intended to identify essential features of the claimed subject matter, nor is it intended for use in determining the scope of the claimed subject matter.

In one aspect, an interface device may include a double-trench structure configured to bond to a flip-chip device electrically and thermally. The double-trench structure may be at least partially metalized and configured to allow a soldering material to flow along each of at least two trenches of the double-trench structure. The two trenches may be closely located adjacent to each other to minimize an electrical separation gap between a cathode and an anode of the flip-chip device while providing electrical isolation therebetween.

In another aspect, an interface device may include a double-trench structure configured to bond to a flip-chip device electrically and thermally. The double-trench structure may be at least partially metalized to allow a soldering material to flow along each of a plurality of trenches of the double-trench structure. Two trenches of the plurality of trenches may be closely located adjacent to each other to minimize an electrical separation gap between a cathode and a anode of the flip-chip device while providing electrical isolation therebetween. The double-trench structure may be connected to a reservoir by one or more other trenches of the plurality of trenches.

BRIEF DESCRIPTION OF THE DRAWINGS

The accompanying drawings are included to provide a further understanding of the disclosure and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 5 shows a structure of V-grooving of an interface device in accordance with the present disclosure.

FIG. 6 shows a detailed cross-sectional view of how the flip-chip device of FIG. 1 is mounted on an interface device in accordance with the present disclosure.

FIG. 8 shows a cross-sectional view across trenches in accordance with the present disclosure.

FIG. 9 shows a cross-sectional view along trenches in accordance with the present disclosure.

FIG. 10 shows various double-trench designs of a W shape, double-square shape and double-U shape in accordance with the present disclosure.

DETAILED DESCRIPTION OF PREFERRED EMBODIMENTS

Overview

Figure 1:
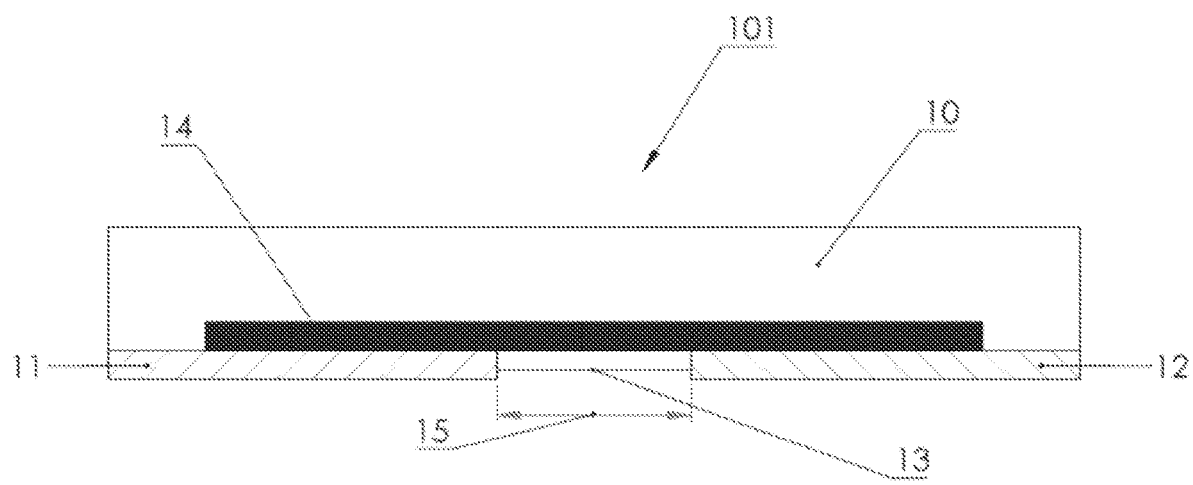
FIG. 1 shows a typical flip-chip device.

The interface substrate needs to bond a flip-chip IC device as much as possible area in order to remove heat-loading while it provides an electrical connection. However, the interface substrate also isolates the cathode and anode of the flip-chip IC device. To achieve a maximum performance of the flip-chip IC the separation gap between cathode and anode has to minimize while maintaining the electrically isolation. The flip-chip IC device can be any device with cathode and anode along with a thermal pad. Such as LEDs, sensors, Lasers, and IC chips are consisting with anode, cathode and thermal pad that is on same plane of device with electrical separation is required.

Typically flip-chip is pushed on the interface substrate where a solder material is laid on the electrical pad. Then, the flip-chip and solder material are heated to bond together. In this melting and bonding process, all extra-solder material will be spread and flattened out and the excess solder material will flow out to all direction. Therefore, the flow-out solder has a chance to short a cathode and anode of an electrical pad if the separation gap is not sufficient. To prevent any short in the electrodes, the separation gap is sufficiently wide to prevent shorting a circuit. However, the wide separation gap creates a problem of reducing thermal contact between the flip-chip device and interface substrate. To avoid the electrical short and minimize the separation gap, the interface substrate is designed with non-metallic substrate such as silicon, silicon carbide, diamond, aluminum nitride, ceramic or graphene. These materials can easily create small trenches by chemically or dry-etching and these trenches are used to catch all the extra-solder material when the solder is melted. The function of the trench is to catch any extra-solder to spread far way and contain the extra-solder in the trench to prevent shorting to other electrical pads.

The trench is designed to separate the cathode and anode and a double-trench style is used to isolate electrical pad in the flip-chip device and achieve a better thermal connection. One of the trenches is electrically connected to the cathode electrode and the other trench is electrically connected with the anode. Each of these trenches are partially metalized to remove the extra-solder when the solder is melted for bonding. Also, it is possible to design the double-trench without metalizing the inside of the trench. The double-trenches are electrically isolated to prevent shorting the cathode and anode for making a non-metal gap between the trenches. The length of the trench is longer than the electrical pad of cathode and anode of the flip-chip device or flip-chip LED. The width of the double-trench is less than the separation gap on the flip-chip device. The double-trench design is needed to isolate the cathode and anode electrode; otherwise, a single trench design has a great potential of shorting the electrodes by excess soldering material when the flip-chip device is soldered. The shape of the double-trench can be 'W' shape, double 'U' shape or double square shape. All these shapes can be made by chemical or dry-etch to create the trench.

One examples of a "W-shape" barrier zone between the electrical pad to prevent any metal over-flow short phenomenon and improve thermal contact using a single crystal silicon wafer. The interface substrate (interposer) can be etched by chemically to form "W-shape" barrier zone for a flip-chip bonding. The "W-shape" silicon double v-groove is partially metalized in each v-groove to electrically isolate both anode and cathode of the flip-chip when it is bonded to the interface structure. Typically, the anode and cathode gap in the flip-chip package can be in the range of a few hundred micron apart due to electrical shortage. Conventionally a few hundred-micron gap is designed to isolate the anode and cathode in LED flip package. For example, one of UV LED chip size of 1 mm×1 mm has a typical 200 microns of separation gap and it is almost 20% area of bonding area and it will lose 20% of thermal contact to the interface substrate. If we can design 50 microns size of the separation gap, then it will lose 5% of thermal contact while it is getting electrical isolation. However, it is not easy to get the separation gap to be less than 5% while it is electrically isolated in few tens' microns. The double-trench structure solves the issue of shorting and provide a maximum thermal contact. A proposed design in accordance with the present disclosure allows to reduce the separation gap down to less than 5% of a total bonding area while preventing an electrical shorting.

The "W-shape" v-groove in silicon interface structure is partially metalized to isolate the anode and cathode bonding of the flip-chip device package. When a metal soldering process by using a sold-paste is applied, the metallized v-groove will flow the solder along the v-groove structure where it is partially metallized, non-metalized area between two v-groove structures (the middle section of "W-shape") will effectively isolate the anode and cathode. These v-grooves can be connected to other v-grooves that is placed out of the flip-chip device removing an excess soldering material that is flown to these v-grooves.

Another advance design of the v-channel, u-channel or square-channel is connecting the channels to a reservoir where the excess solder material can overflow. We have designed an over-flow structure to remove the excess solder for shorting a cathode and anode and reduce the bonding thickness of the soldering material for better thermal dissipation. The double-trench design has a great advantage of preventing electrical short and improve the thermal conduction of the interface structure.

Illustrative Implementations

FIG. 1 shows a typical flip-chip package 101 that consist with a cover 10, active circuit 14, anode 11, cathode 12, a gap 13 and separation distance 15. The flip-chip package 101 is a typical high-power LED or IC chips that configure as high temperature electronic component. The separation gap is important so that it will isolate electrical isolation between the anode 11 and the cathode 12. It is difficult to make the separation distance 15 to as small as possible and achieve the gap 13 to be narrow. The narrow gap 13 is necessary to bond as much as surface area of the flip-chip device 101 to mount on to a substrate that provide an electrical and thermal connection.

Figure 2:
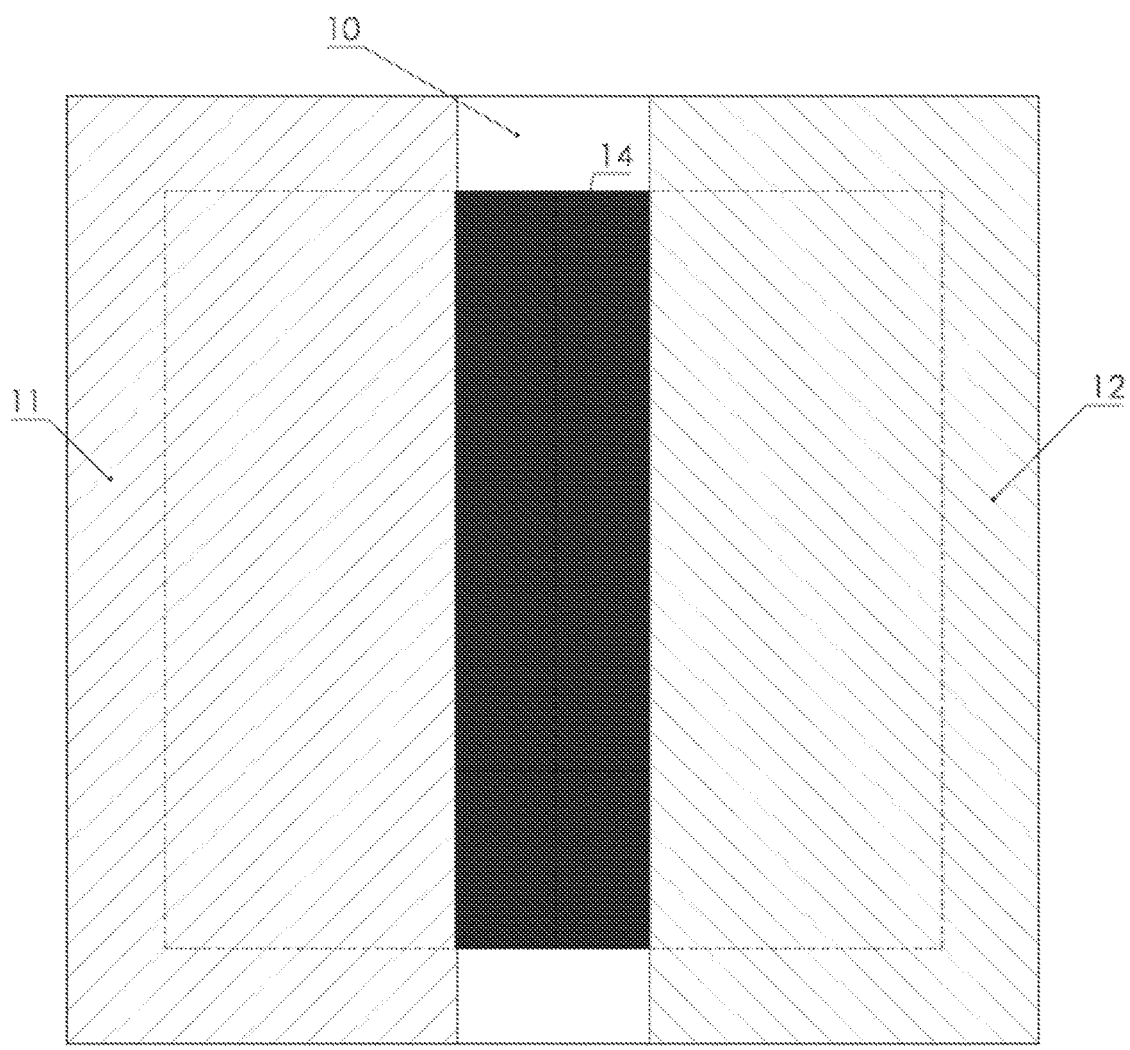
FIG. 2 show a bottom view of the flip-chip device of FIG. 1.

FIG. 2 shows a bottom view of the flip-chip device 101 that show both the anode 11 and the cathode 12 and the active circuit 14 is also shown on the drawing.

Figure 3:
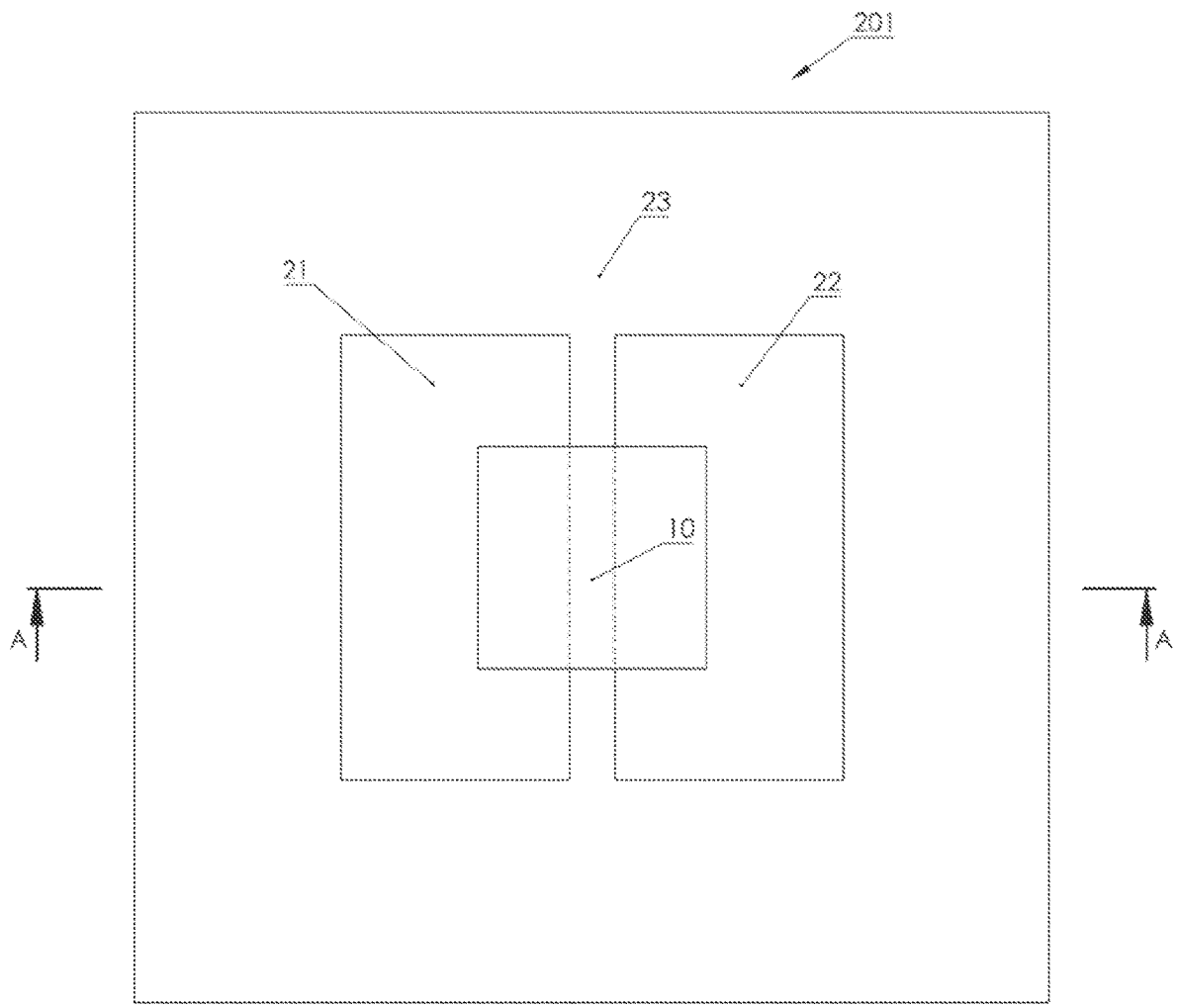
FIG. 3 shows a package of the flip-chip device of FIG. 1 mounted on an interface device in accordance with the present disclosure.

FIG. 3 shows the flip-chip 101 is mounted on an interface device 23. The module 201 consists with the flip-chip 101 and the interface device 23 to make the module 201. The illustration shows that the flip-chip 101 is mounted on the interface device 23. The metallization pad 21 and 22 is connected to the anode 11 and cathode 12 on the flip-chip device 101.

Figure 4:
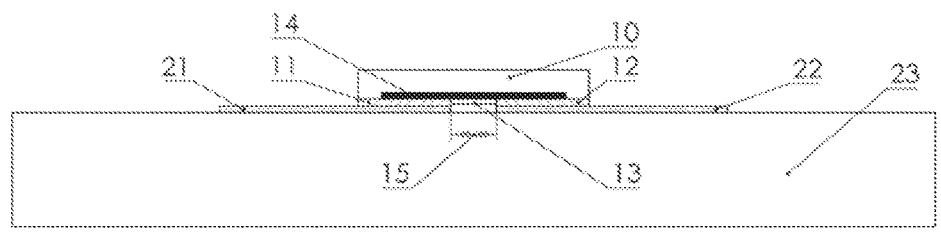
FIG. 4 shows a detailed cross-sectional view of the package of FIG. 3 in accordance with the present disclosure.

FIG. 4 shows a detailed cross-sectional view of FIG. 3. The interface device 23 has an electrical pad 21 and the electrode pad 22. The electrical pad 21 is bonded to the anode 11 of the flip-chip device 101 and the electrical pad 22 is bonded to the anode 12 respectively. Both anodes and cathodes are bonded with solder, silver sintering, gold/tin or electrical conducting epoxy. Note that the gap 13 and the separation distance 15 is closely match with the electrical pads 21 and 22 in the interface device 23.

FIG. 5 shows a special structure of V-grooving of the interface device 33 to minimize the size of the gap 13 and the separation distance 15. The flip-chip device 101 mounting on the interface device 33 is constructed as a module 301. The flip-chip 101 bonding to the interface device 33 fails due to an electrical shorting between the anode 11 and the cathode 12 of the flip-chip device 101. To prevent electrical shorting in the electrodes, the gap 13 or the separation distance 15 need to increase for preventing the electrical shorting. However, increasing the gap 13 causes an issue of lowing a thermal conduction between the flip-chip 101 to the interface device 33 due to reducing thermal contact area. The thermal performance is proportion to the area of contact between the flip-chip device 101 and the interface device 33. The V-groove structure 34 and 35 forms a double trench structure shows an advantage of isolating the electrode pads 31 and 32. The electrode pad 31 and 32 is layout on the interface device 33 where the anode 11 and cathode 12 of the flip-chip device 101 is mounted on each electrode pad 31 and 32 respectively. The electrode pad 31 is metalized to the half of the v-groove structure 35 and the electrode pad 32 is also metalized to the half of the v-groove structure 34 as shown in the drawing. The other half of the v-groove 34 and 35 is not metalized for an electrical isolation of two electrode pads 31 and 32. The reason of the half metallization is to trap any excess solder to migrate toward each trench 34 and 35 when the flip-chip device 101 is solder to the interface device 33. The extra metallization in the trench 34 and 35 allows flowing an excess solder to the trench 34 and 35 while it provides an electrical isolation. The electrical pads 31 and 32 is longer than the anode 11 and the cathode 12 of the flip-chip device 101. The combined width of the electrical pads 31 and 32 is equal or less than the gap 13 or the separation distance 15 of the flip-chip device 101.

FIG. 6 shows a detailed cross-sectional view of how the flip-chip 101 is mounted on the interface device 33 and the detailed view of the trench structure 34 and 35 is shown in expanded view. The detailed half metallization in the trench structure 34 and 35 is also shown on the drawing. In this design the gap 13 or the separation distance 15 can be designed to form a less than 50 to 200 microns trench depend on the limitation of MEMS fabrication limitation. The trench structure 34 and 35 can be easily fabricate in silicon material due to anisotropic etch of single crystal silicon such as the face orientation of <100> silicon can easily fabricate less than 20 microns of the v-groove structure. The depth of the trench 34 and 35 is shallowed than the width of the trench 34 and 35 for better thermal performance.

Figure 7:
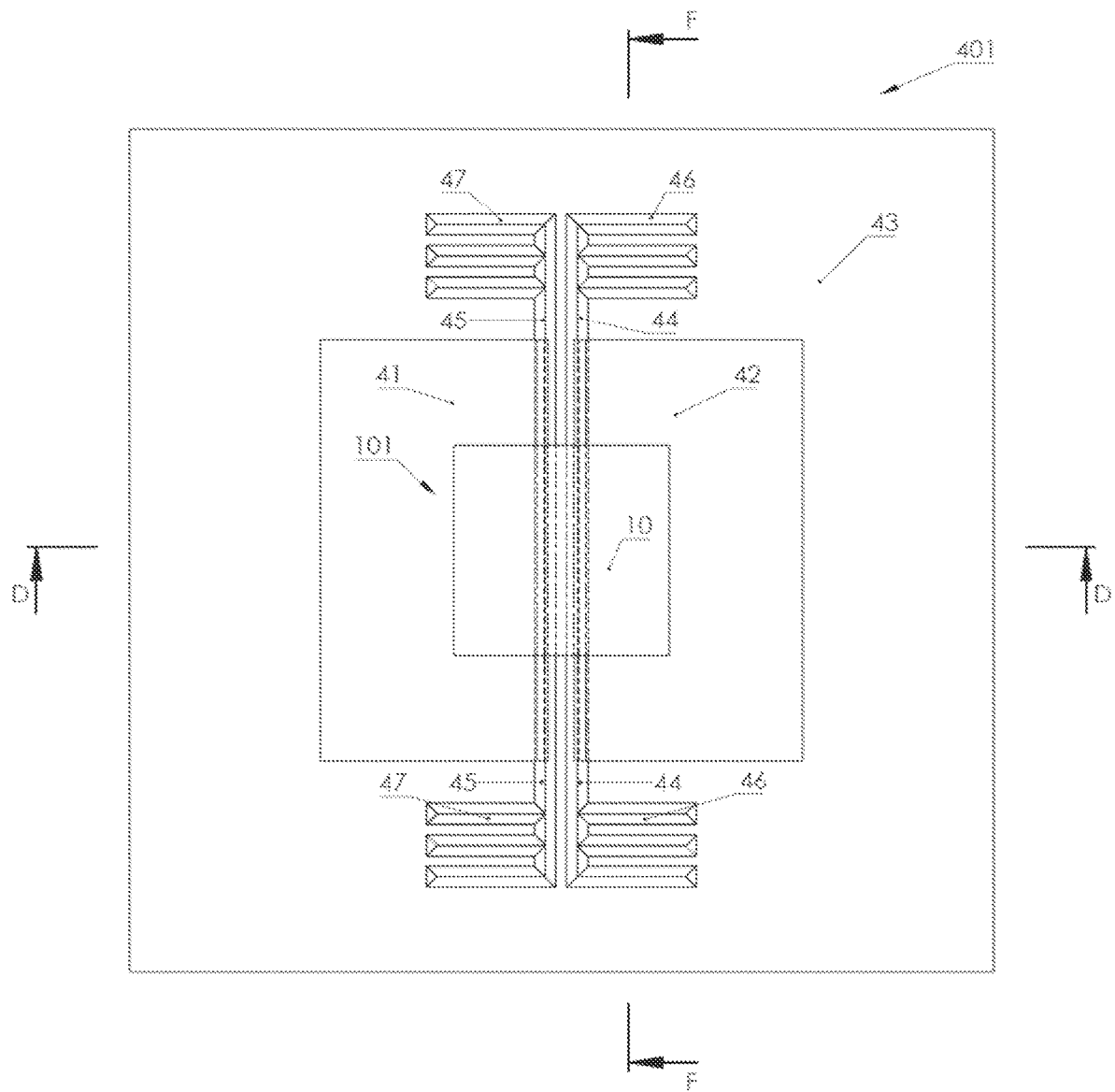
FIG. 7 shows a design of trenches and reservoir structure in accordance with the present disclosure.

FIG. 7 shows an expanded design of trenches and reservoir structure. The device module 401 has an interface device 43 with trench structures 44 and 45 along with a reservoir structures 46 and 47. The electrode pad 41 and 42 are also metalized the half of the trenches 44 and 45 for flowing an excess solder. The flip-chip 101 is bonded to the electrode pad 41 and 42. In this design, the reservoir structure 46 and 47 are connected to the trench structure 44 and 45. Also the reservoir structure 46 and 47 are metalized to connect to the trenches 44 and 45 by electrically isolating two trenches. The metallization of the trench 45 is continuously connect to the reservoir structure 47 and the metallization of the trench 44 is continuously connect to the reservoir structure 46. However, the reservoir structure 46 and 47 is electrically isolated to each other due to electrical isolation of the flip-chip device 101. If an excess amount of solder material is used to bonding the flip-chip device 101, it is necessary to have a large size of a reservoir structure 46ad 47 to capture the solder material for preventing electrode shorting.

FIG. 8 shows a cross-sectional view of cutting through the trench 45 and 46. The detailed view show how the metallization layer is layout inside of the trenches 44 and 45.

FIG. 9 shows a cross-sectional view along the trenches 44 and 45, and the cross-section of the reservoir structure 46 and 47. A group of the trenches 44 and 45 forms a reservoir structure 46 and 47 for storing any excess solder from a soldering process.

FIG. 10 shows various designs of double-trench design for a W-shape, double square shape, and double U-shape. Many double trench designs can be implemented for constructing the interface device.

Highlight of Select Features

In view of the above, select features in accordance with the present disclosure are highlighted below.

In one aspect, an interface device may include a double-trench structure configured to bond to a flip-chip device electrically and thermally. The double-trench structure may be at least partially metalized and configured to allow a soldering material to flow along each of at least two trenches of the double-trench structure. The two trenches may be closely located adjacent to each other to minimize an electrical separation gap between a cathode and an anode of the flip-chip device while providing electrical isolation therebetween.

In some implementations, a cross-sectional view of the two trenches of the double-trench structure may resemble a W shape with two V-grooves.

In some implementations, the double-trench structure may have an electrical isolation gap between the two trenches.

In some implementations, a length of the double-trench structure may be longer than a cathode and an anode of the flip-chip device.

In some implementations, a width of the double-trench structure may be equal to or less than a separation gap of the flip-chip device.

In some implementations, a depth of the double-trench structure may be less than a width of each trench of the two trenches.

In some implementations, each trench of the two trenches may be electrically connected to a respective one of an anode and a cathode of the flip-chip device.

In some implementations, the two trenches may be at least partially metalized to allow flowing of any excess soldering material.

In some implementations, an isolation gap between the two trenches may be less than a width of each of the two trenches.

In another aspect, an interface device may include a double-trench structure configured to bond to a flip-chip device electrically and thermally. The double-trench structure may be at least partially metalized to allow a soldering material to flow along each of a plurality of trenches of the double-trench structure. Two trenches of the plurality of trenches may be closely located adjacent to each other to minimize an electrical separation gap between a cathode and a anode of the flip-chip device while providing electrical isolation therebetween. The double-trench structure may be connected to a reservoir by one or more other trenches of the plurality of trenches.

In some implementations, a cross-sectional view of the two trenches of the double-trench structure may resemble a W shape with two V-grooves.

In some implementations, the double-trench structure may have a respective electrical isolation gap between every two adjacent trenches of the plurality of trenches.

In some implementations, a length of the double-trench structure may be longer than the cathode and the anode of the flip-chip device.

In some implementations, a width of the double-trench structure may be equal to or less than a separation gap of the flip-chip device.

In some implementations, a depth of the double-trench structure may be less than a width of each of the two trenches.

In some implementations, each of the two trenches may be electrically connected to a respective one of the anode and the cathode of the flip-chip device.

In some implementations, the two trenches may be at least partially metalized to allow flowing of any excess soldering material.

In some implementations, an isolation gap in the double-trench structure may be less than a width of each of the two trenches.

ADDITIONAL NOTES AND CONCLUSION

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An interface device comprising:
a double-trench structure configured to bond to a flip-chip device electrically and thermally,
wherein the double-trench structure is at least partially metalized and configured to allow a soldering material to flow along each of at least two trenches of the double-trench structure,
wherein the two trenches are closely located adjacent to each other to minimize an electrical separation gap between a cathode and an anode of the flip-chip device while providing electrical isolation therebetween, and
wherein a cross-sectional view of the two trenches of the double-trench structure resembles a W shape with two V-grooves.

2. The interface device of claim 1, wherein the double-trench structure has an electrical isolation gap between the two trenches.

3. The interface device of claim 1, wherein a length of the double-trench structure is longer than a cathode and an anode of the flip-chip device.

4. The interface device of claim 1, wherein a width of the double-trench structure is equal to or less than a separation gap of the flip-chip device.

5. The interface device of claim 1, wherein a depth of the double-trench structure is less than a width of each trench of the two trenches.

6. The interface device of claim 1, wherein each trench of the two trenches is electrically connected to a respective one of an anode and a cathode of the flip-chip device.

7. The interface device of claim 1, wherein the two trenches are at least partially metalized to allow flowing of any excess soldering material.

8. The interface device of claim 1, wherein an isolation gap between the two trenches is less than a width of each of the two trenches.

9. An interface device comprising:
a double-trench structure configured to bond to a flip-chip device electrically and thermally,
wherein the double-trench structure is at least partially metalized and configured to allow a soldering material to flow along each of at least two trenches of the double-trench structure,
wherein the two trenches are closely located adjacent to each other to minimize an electrical separation gap between a cathode and an anode of the flip-chip device while providing electrical isolation therebetween, and
wherein a width of the double-trench structure is equal to or less than a separation gap of the flip-chip device.

10. An interface device comprising:
a double-trench structure configured to bond to a flip-chip device electrically and thermally,
wherein the double-trench structure is at least partially metalized and configured to allow a soldering material to flow along each of at least two trenches of the double-trench structure,
wherein the two trenches are closely located adjacent to each other to minimize an electrical separation gap between a cathode and an anode of the flip-chip device while providing electrical isolation therebetween, and
wherein an isolation gap between the two trenches is less than a width of each of the two trenches.

* * * * *